(12) United States Patent
Chun-Jen et al.

(10) Patent No.: US 6,337,510 B1
(45) Date of Patent: Jan. 8, 2002

(54) STACKABLE QFN SEMICONDUCTOR PACKAGE

(75) Inventors: Su Chun-Jen; Lin Chien-Tsun; Chang Chao-Chia; Su Yu-Hsien; Tseng Ming-Hui, all of Kaohsiung (TW)

(73) Assignee: Walsin Advanced Electronics LTD, Kaohsiung (TW)

( * ) Notice: Subject to any disclaimer, the term of this patent is extended or adjusted under 35 U.S.C. 154(b) by 0 days.

(21) Appl. No.: 09/714,157

(22) Filed: Nov. 17, 2000

(51) Int. Cl.[7] .............................................. H01L 23/495
(52) U.S. Cl. ........................ 257/666; 257/686; 257/777
(58) Field of Search ................................ 257/666, 686, 257/676, 723, 777, 778

(56) References Cited

U.S. PATENT DOCUMENTS

| 6,020,629 A | 2/2000 | Farnworth et al. | 257/686 |
| 6,075,284 A | 6/2000 | Choi et al. | 257/676 |
| 6,146,918 A * | 11/2000 | Lee | 257/666 |

FOREIGN PATENT DOCUMENTS

JP   10-074859   3/1998

* cited by examiner

Primary Examiner—Roy Potter
(74) Attorney, Agent, or Firm—Troxell Law Office PLLC

(57) ABSTRACT

A stackable QFN semiconductor package comprises a die, a lead frame, an electrical connection device, and a molding compound. The die has a plurality of bonding pads on its topside. The lead frame consists of a plurality of inner leads around edge of the die and each inner lead is divided into the body and the finger extending from the body. The body is thicker than the die and exposes its upper surface and lower surface for outer electrical connection of the package. The finger extends from the body to above the topside of the die. An electrical connection device connects the bonding pad of die and the finger of inner lead, thus electrically connect the die and the inner lead of lead frame. A molding compound seals around outer edge of the inner lead and seals off at least said electrical connection device; therefore provide ability of stack, thinner package and simplicity.

4 Claims, 4 Drawing Sheets

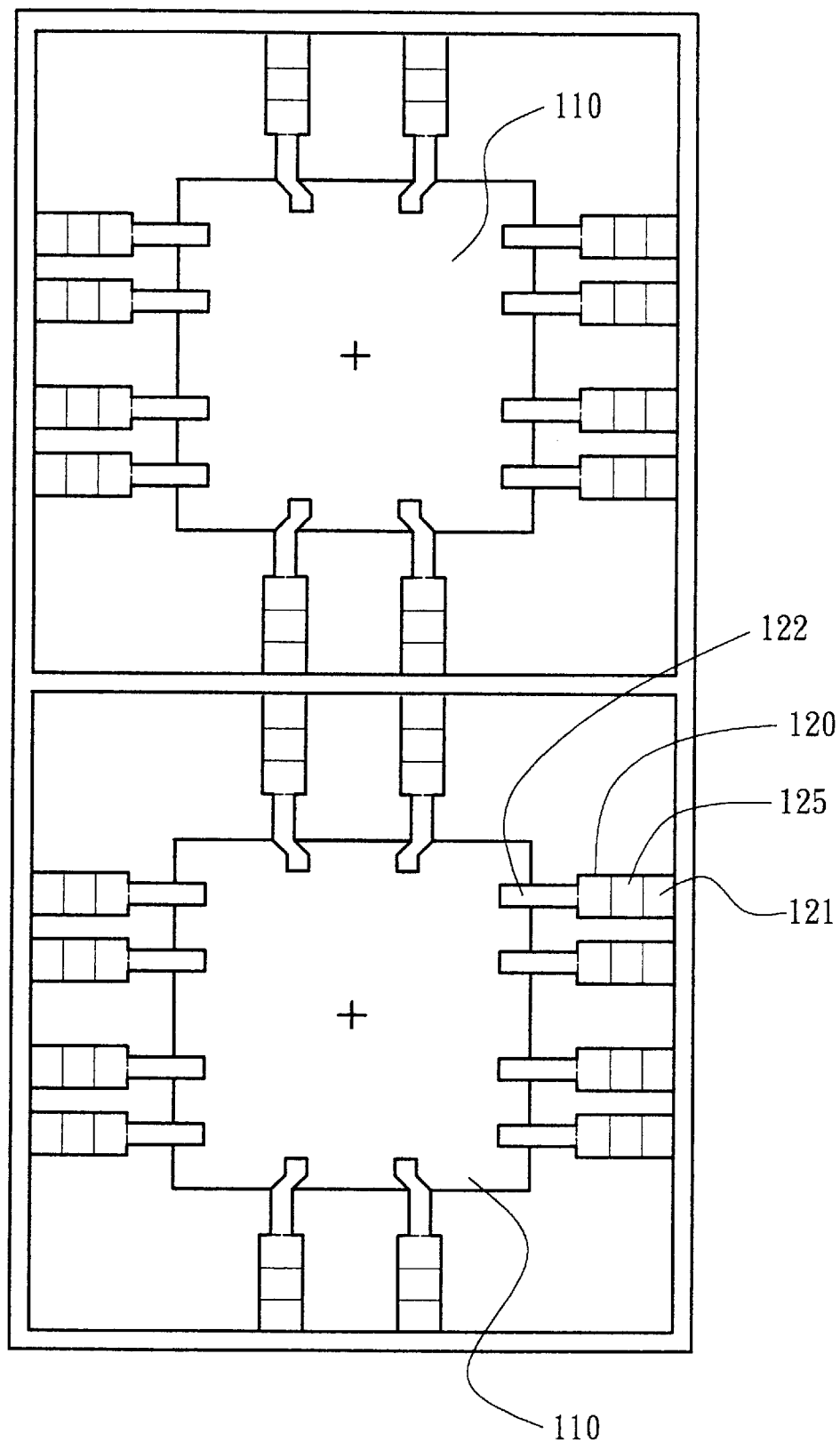
F I G . 2

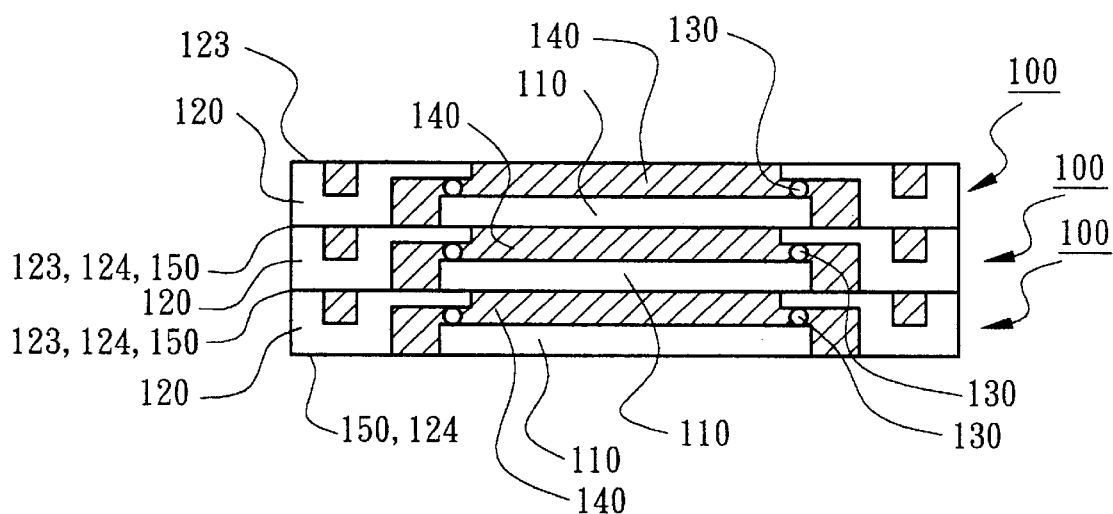
F I G . 3
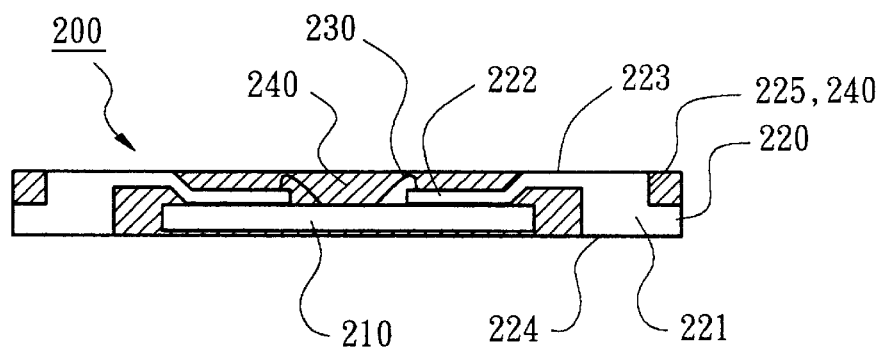
F I G . 4

STACKABLE QFN SEMICONDUCTOR PACKAGE

BACKGROUND OF THE INVENTION

1. Field of the Invention

The present invention relates to a stackable QFN semiconductor package and, in particular, to a super thin quad flat non-leaded semiconductor package without substrate.

2. Description of the Prior Art

A generally known U.S. Pat. No. 6,075,284 stackable semiconductor package can be stacked face to face, back to back by having its inner leads of the lead frame to extend protruding portions upward and downward respectively to form a package structure. But, with lead frame in such particular shape, it is difficult to process by method of etching or stamping. Besides, with inner lead of lead frame being located on two laterals of the package structure, it is categorized as dual-in-line package (DIP) and cannot be used to pack die(s) with more electrodes as a quad flat package (QFP) does.

According to shape of the outer lead, there are three types of Quad Flat Package (QFP), known as Quad Flat I-leaded (QFI) type, Quad Flat J-leaded (QFJ) type, and Quad Flat Non-leaded (QFN) type. With hidden lead and tightly sticking to circuit board during bonding, QFN package meets the demand of being light, thin, simple and compact for modem electricity components, especially components used in mobile electronics, such as cellular phone or notebook computer, etc.

A generally known Japan Patent No.10-74859 uses gold Circuits on the surface and edge of a substrate for electrical connecting to the die and integrate application of U.S. Pat. No. 6,020,629 DIP package to form a hollow as die container in the middle of the substrate. There are columns around the edge of the substrate for passing through top to bottom and construct a stackable package. But still it uses a complex substrate and is difficult to manufacture, the cost is higher and also the package structure is thick.

SUMMARY OF THE INVENTION

Therefore it is the first object of the invention to provide a stackable QFN semiconductor package, in which, by using inner lead of lead frame to form a thicker portion around the die and the thicker portion having its upper face and lower face exposed outside the molding compound, thus the QFN semiconductor package is able to be multiple stacked and also not to increase thickness of the package structure with simple structure.

It is the second object of the invention to provide a QFN package, in which, by using inner lead of lead frame to have its finger extend to the position above the die and to have the thickness of body of inner lead and thickness of the package structure being, of the same. Thus, the stackable QFN semiconductor package becomes a stackable QFN semiconductor package with a configuration of lead on chip or flip chip on lead frame.

In accordance with aspect of the invention, a QEN semiconductor package comprises a die having a plurality of bonding pads on its topside; a lead frame consisting of a plurality of inner leads around the die, wherein each inner lead being divided into the body and the finger extending from it; wherein, the body is thicker than the die and expose at least its upper face and lower face for outer electrical connection of the QFN package structure and the finger of the inner lead extend to above the die; an electrical connecting device for connecting bond pad of the die and finger of inner lead to electrically connect the die and inner lead of lead frame; and a molding compound that seals along edge of inner lead and at least seal said electrical connecting device and enhance the QFN semiconductor package stackable, thinner package thickness and simple structure.

BRIEF DESCRIPTION OF THE DRAWINGS

FIG. 2 is a plan view illustrating the die and the lead frame of the stackable QFN package according to a first embodiment of the present invention;

FIG. 3 is a sectional view illustrating a stack structure of multiple stackable QFN packages according to a first embodiment of the present invention;

FIG. 4 is a sectional view illustrating a stackable QFN package according to a second embodiment of the present invention.

DETAILED DESCRIPTION OF THE PREFERRED EMBODIMENT

Figure 1:
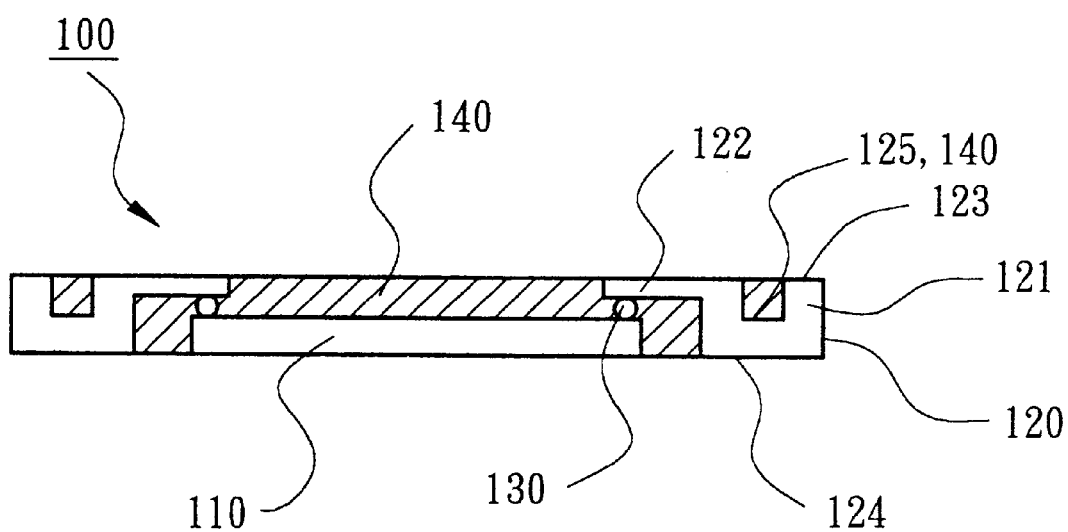
FIG. 1 is a sectional view illustrating a stackable QFN package according to a first embodiment of the present invention.

Referring now to the drawings, the QFN packages according to the individual embodiments of the present invention will be described.

FIG. 1 and FIG. 2 show the structure of a quad flat non-leaded package (QFN) according to a first embodiment of the present invention. The QFN package 100 comprises a die 110, a lead frame, solder bumps 130 and a molding compound 140. First thing to know is that relative position of components of the stackable QFN semiconductor package is disclosed for illustrative purposes but not for constraining. For instance, shown in FIG. 1, the QFN semiconductor package 100 is devised the die on the bottom with its topside facing upward and the inner lead 120 above the die 110 (lead on chip). When turn upside down the package structure shown on FIG. 1, the combination of the structure will be the die 110 on top of the package with topside facing downward and the inner lead 120 beneath the die 110 (flip-chip on lead frame). Both combinations explain the same QFN semiconductor package 100. To further describe:

The die 110, topside facing up, laminated with a variety of desired electrical or electronic circuits and lines and formed at the upper surface thereof with a plurality of bonding pads (aluminum) for electrically connecting to outer, on the other hand, the reverse side. Thickness of a die is between 0.2 mm and 0.7 mm, 0.3 mm in general.

The solder bumps 130, being formed on bonding pads of the die, is for the electrical connection between the die 110 and inner lead 120 of lead frame, and generally made of gold or conductive metal containing lead and tin.

The molding compound 140 is made of insulating thermosetting epoxy resin. It seals alone the edge of the inner lead 120 and at least seals the solder bumps 130 to protect the stackable QFN semiconductor package 100. In this embodiment, the molding compound 140 exposes the reverse side of die 110 to reduce thickness of the QFN semiconductor package.

The lead frame typically is made of copper or iron. It consists of a plurality of inner leads 120 around the die 110. The inner lead 120 consists of the body 121 and the finger 122 extending from the body. The body 121 is thicker than the die 110 and is between 0.4 mm and 2.0 mm in thickness. The best practice is to let the body 121 has the same thickness as the thickest part of the stackable QFN semiconductor package 100. Thus, the body 121 at least exposes its upper surface and lower surface, which means, not being covered by the molding, compound 140. In this embodiments, the upper surface 123 of body 121 form a depression 125 for the molding compound 140 to fill, and thus provides inner lead 120 of the QFN semiconductor package 100 with stronger stability. The finger 122 extends from the body 121 to above the die 110 (lead on chip), and the thickness of the finger 122 is about 0.2 mm, that make the shortest distance between the inner lead 120 and the bonding pad of die 110. The finger 122 also can be used to support to or firmly stick to the die 110.

As shown in FIG. 1 and FIG.3, to stack multiple said QFN semiconductor packages 100 is implemented by using conductive resin 150 made from silver epoxy or solder paste to stick QFN semiconductor packages stacked up. Thus, it provides the invention with stack ability of QFN semiconductor package and with ability of being thinner and simpler than generally known stackable QFN semiconductor package by using a laminated substrate with a plurality of passing-through copper columns. Also, when multiple stackable QFN semiconductor packages 100 are stacked up, these can be tested concurrently.

For the stackable QFN semiconductor package 100 of this invention having the body 121 of inner lead 120 thicker than the finger 122, the inner leads 120 form a thicker portion around the die 110. By method of etching, the lead frame is shaped up to body 121 and finger 122 of different thickness.

Using solder bumps is not the only way to electrically connect the die and the lead frame. Shown in FIG.4 is the second embodiment of stackable QFN semiconductor package 200 of this invention. The combination structure, such as die 210, inner lead 220, is similar to as in the first embodiment 100. But, this embodiment uses bonding wires 230 to electrically connect die 210 and the inner leads 220 of lead frame. For the finger 222 of inner lead 220 extending to above the die 210 (lead on chip), there is a shortest distance between the die 210 and the inner lead 220 for easy wire bonding. The finger 222 of inner lead 220 also can be used to support or firmly stick to the die 210. The depression portion 225 of body 221 can be located at outer edge of upper surface for the molding compound 240 to fill in. The molding compound 240 can seal the whole die 210 and thus increases the stability of the die 210 in the QFN semiconductor package. Same as in the first embodiment, the body 221 of inner lead of the QFN semiconductor package 200 comprises of upper surface 222 and lower surface 224 and has stack ability.

Figure 5:
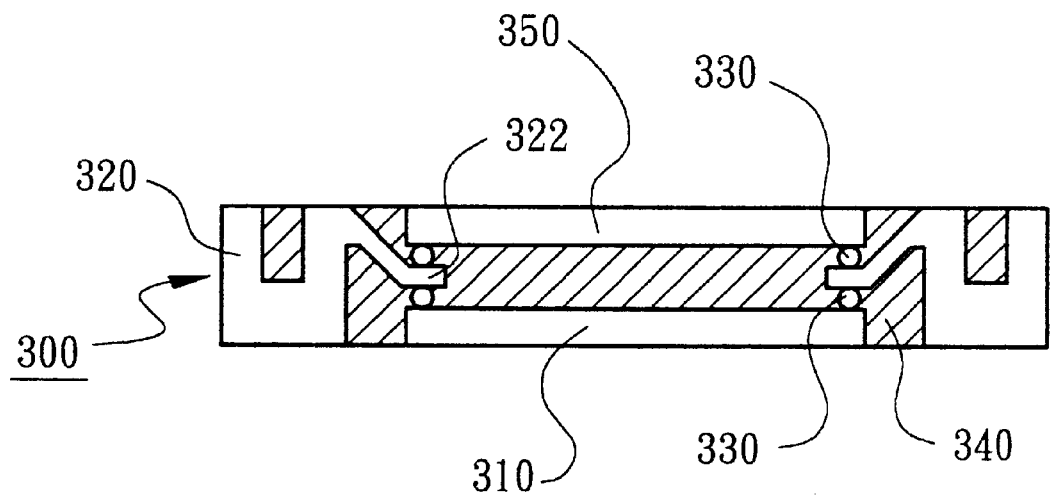
FIG. 5 is a sectional view illustrating a stackable QFN package according to a third embodiment of the present invention.

FIG. 5 shows the third embodiment of the invention as another stackable QFN semiconductor package 300. The combination structure is quite the same as in the stackable QFN structure 100 of the first embodiment, except that there is one another second die 350 included. Within, the second die 350 is almost of the same size as the first die 310, and there are bolder bumps 330 on the bonding pads of the second die 350, and the second die 350 has it topside face downward (flip chip), and form a face to face with the first die 310 clip to clip the finger 322 of inner lead 320. In the embodiment, the body 321 of inner lead 320 is thicker than the total thickness of the first die 310 and the second die 350, so the QFN semiconductor package 300 can pack two dies and be a stackable QFN semiconductor package.

Figure 6:
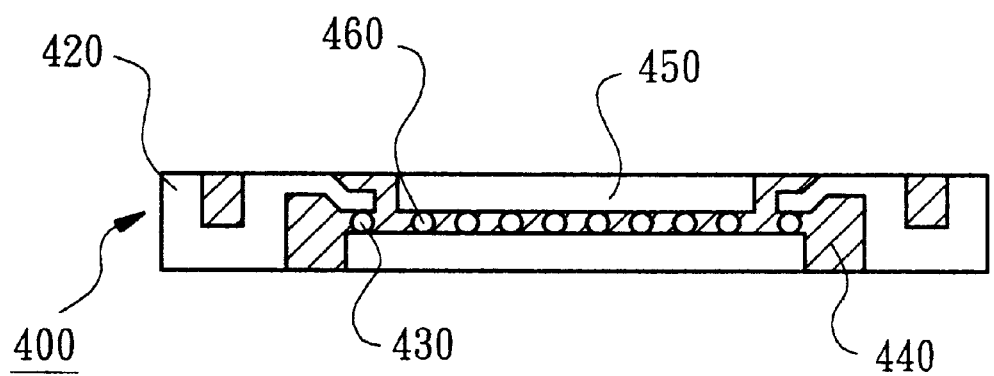
FIG. 6 is a sectional view illustrating structure of a semiconductor package according to a forth embodiment of the present invention.

FIG. 6 shows the fourth embodiment as another double-die package and stackable QFN semiconductor package 400. Except for the arrangement of second die 450 and the electrical connecting device, the QFN semiconductor package 400 has the structure similar to QFN semiconductor package 300 of the third embodiment. The second die 450 is smaller than the first die 410 and makes it not to contact with the inner lead 420 of lead frame. But, the first die 410 and the second die 450, as flip chip, face to face to form circuit connection. The way to do it is to use the pre-printed electronic circuit on the active surface of the first die 410, wherein the electronic circuit has bonding ends for the second solder bumps 460 of the second die 450 which connect to the bonding pads of the first die 410. Then, use the first solder bump 430 on the bonding pad of the first die 410 to electrically connect corresponding finger 422 of the inner lead 420. Similar as in previous embodiment, the body 421 of inner lead 420 is thicker than the total thickness of the first die 410 and the second die 450, and exposes the upper and lower surface of the body 421 for stackable and outer electrical connection of the package. Thus, that the QFN semiconductor package 400 is a double die package and stackable QFN semiconductor package.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A stackable QFN semiconductor package comprising:
    a die with a plurality of bonding pads on a topside;
    a lead frame having a plurality of inner leads around an edge of the die, each inner lead being divided into a body and a finger portion extending from the body; wherein the body is thicker than the die and has at least an exposed upper surface and a lower surface for the package to be electrically connecting to an outer; wherein the finger portion extends from the body to above the topside of the die;
    an electrical connection device connecting the bonding pads of the die and the finger portions of the inner leads for electrically connecting the die and the inner lead of the lead frame; and,
    a molding compound sealing around an outer edge of the inner lead and sealing off at least said electrical connection device, wherein the electrical connection device comprises solder bumps, and further comprising a second die with bumps being in a flip-chip configuration located face-to-face on the first die to clip the fingers of the inner leads.

2. The stackable QFN semiconductor package according to claim 1 wherein the body of the inner lead is thicker than a total thickness of the first die and the second die.

3. A stackable QFN semiconductor package comprising:
    a die with a plurality of bonding pads on a topside;
    a lead frame having a plurality of inner leads around an edge of the die, each inner lead being divided into a body and a finger portion extending from the body; wherein the body is thicker than the die and has at least an exposed upper surface and a lower surface for the package to be electrically connecting to an outer; wherein the finger portion extends from the body to above the topside of the die;

an electrical connection device connecting the bonding pads of the die and the finger portions of the inner leads for electrically connecting the die and the inner lead of the lead frame; and, a molding compound sealing around an outer edge of the inner lead and sealing off at least said electrical connection device, wherein the electrical connection device comprises solder bumps, shaped on the bonding pads, and further comprising a second die, wherein the second die is smaller than the first die and has solder bumps disposed face-to-face with the solder bumps on the first die.

4. The stackable QFN semiconductor package according to claim 3 wherein the body of the inner lead is thicker than a total thickness of the first die and the second die.

* * * * *